United States Patent
Liou et al.

(10) Patent No.: US 9,660,022 B2
(45) Date of Patent: May 23, 2017

(54) SEMICONDUCTIVE DEVICE WITH A SINGLE DIFFUSION BREAK AND METHOD OF FABRICATING THE SAME

(71) Applicant: UNITED MICROELECTRONICS CORP., Hsin-Chu (TW)

(72) Inventors: En-Chiuan Liou, Tainan (TW); Chih-Wei Yang, Kaohsiung (TW); Yu-Cheng Tung, Kaohsiung (TW); Chia-Hsun Tseng, Tainan (TW)

(73) Assignee: UNITED MICROELECTRONICS CORP., Hsin-Chu, Taiwan (TW)

( * ) Notice: Subject to any disclaimer, the term of this patent is extended or adjusted under 35 U.S.C. 154(b) by 0 days.

(21) Appl. No.: 14/830,756

(22) Filed: Aug. 20, 2015

(65) Prior Publication Data
US 2017/0053980 A1    Feb. 23, 2017

(51) Int. Cl.
| | |
|---|---|
| *H01L 27/088* | (2006.01) |
| *H01L 29/06* | (2006.01) |
| *H01L 29/66* | (2006.01) |
| *H01L 21/8234* | (2006.01) |
| *H01L 21/311* | (2006.01) |
| *H01L 21/762* | (2006.01) |

(52) U.S. Cl.
CPC .... *H01L 29/0649* (2013.01); *H01L 21/31144* (2013.01); *H01L 21/76224* (2013.01); *H01L 21/823431* (2013.01); *H01L 21/823437* (2013.01); *H01L 21/823481* (2013.01); *H01L 27/0886* (2013.01); *H01L 29/6656* (2013.01); *H01L 29/66545* (2013.01)

(58) Field of Classification Search
CPC ....... H01L 21/76224; H01L 21/823431; H01L 21/764; H01L 21/823481; H01L 21/32139; H01L 21/845; H01L 27/0203; H01L 27/0886; H01L 29/165; H01L 29/66545; H01L 29/66795; H01L 29/7848
See application file for complete search history.

(56) References Cited

U.S. PATENT DOCUMENTS

| | | | |
|---|---|---|---|
| 4,356,211 | A | 10/1982 | Riseman |
| 4,627,152 | A | 12/1986 | Dehond |
| 5,098,856 | A | 3/1992 | Beyer |
| 6,406,975 | B1 | 6/2002 | Lim |

(Continued)

OTHER PUBLICATIONS

Chen, Title of Invention: A High-Voltage FinFET Device Having LDMOS Structure and Method for Manufacturing the Same, U.S. Appl. No. 14/583,771, filed Dec. 29, 2014.

*Primary Examiner* — Bradley K Smith
*Assistant Examiner* — David Goodwin
(74) *Attorney, Agent, or Firm* — Winston Hsu; Scott Margo

(57) ABSTRACT

A method of fabricating a single diffusion break includes providing a fin with two gate structures crossing the fin and a middle dummy gate structure crossing the fin, wherein the middle dummy gate structure is sandwiched by the gate structures. Later, numerous spacers are formed and each spacer respectively surrounds the gate structures and the middle dummy gate structure. Then, the middle dummy gate structure, and part of the fin directly under the middle dummy gate structure are removed to form a recess. Finally, an isolating layer in the recess is formed to close an entrance of the recess so as to form a void embedded within the recess.

13 Claims, 5 Drawing Sheets

(56) References Cited

U.S. PATENT DOCUMENTS

| | | |
|---|---|---|
| 6,791,155 B1 | 9/2004 | Lo |
| 8,519,481 B2 | 8/2013 | Yuan |
| 8,609,510 B1 | 12/2013 | Banna |
| 8,846,491 B1 | 9/2014 | Pham |
| 8,878,309 B1 | 11/2014 | Hong |
| 2011/0084340 A1* | 4/2011 | Yuan ................. H01L 21/76224 257/368 |
| 2015/0054089 A1* | 2/2015 | Hong ................. H01L 27/0886 257/401 |
| 2015/0147860 A1* | 5/2015 | Kim ................. H01L 29/66795 438/283 |

* cited by examiner

SEMICONDUCTIVE DEVICE WITH A SINGLE DIFFUSION BREAK AND METHOD OF FABRICATING THE SAME

BACKGROUND OF THE INVENTION

1. Field of the Invention

The present invention relates to a method of fabricating a single diffusion break, and more particularly, to a method of fabricating a single diffusion break on a fin.

2. Description of the Prior Art

In most integrated circuit applications, the substrate area allocated to implement various integrated circuit functions continues to decrease in size. For the circuit to function, many individual devices need to be electrically isolated from one another. Accordingly, electrical isolation is an important and integral part of semiconductor device design for preventing unwanted electrical coupling between adjacent components and devices.

As device scale decreases and device density increases, consistency of neighboring structures may be affected. As the industry strives towards a greater density of active components per unit area of semiconductor substrate, effective isolation between circuits becomes increasingly important.

SUMMARY OF THE INVENTION

It is therefore an objective of the present invention to provide a single diffusion break as a new method of isolation.

According to a first preferred embodiment, a method of fabricating a single diffusion break includes providing a fin with two gate structures crossing the fin and a middle dummy gate structure crossing the fin, wherein the middle dummy gate structure is sandwiched by the gate structures. Later, numerous spacers are formed and each spacer respectively surrounds the gate structures and the middle dummy gate structure. Then, the middle dummy gate structure and part of the fin directly under the middle dummy gate structure are removed to forma recess. Finally, an isolating layer in the recess is formed to close an entrance of the recess so as to form a void embedded within the recess.

According to a second preferred embodiment, a semiconductive device with a gate structure diffusion break includes a fin divided into a first active region and a second active region, wherein a single diffusion break is disposed between the first active region and the second active region, and the single diffusion break comprises avoid inside, wherein part of the single diffusion break is embedded in the fin and the rest of the single diffusion break is higher than a top surface of the fin within the first active region. The semiconductive device further includes a first gate structure crossing the fin within the first active region and a second gate structure crossing the fin within the second active region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 6 depict a method of fabricating a single diffusion break according to a first preferred embodiment of the present invention, wherein FIG. 2 is a sectional view taken along line AA' in FIG. 1.

DETAILED DESCRIPTION

Figure 1:
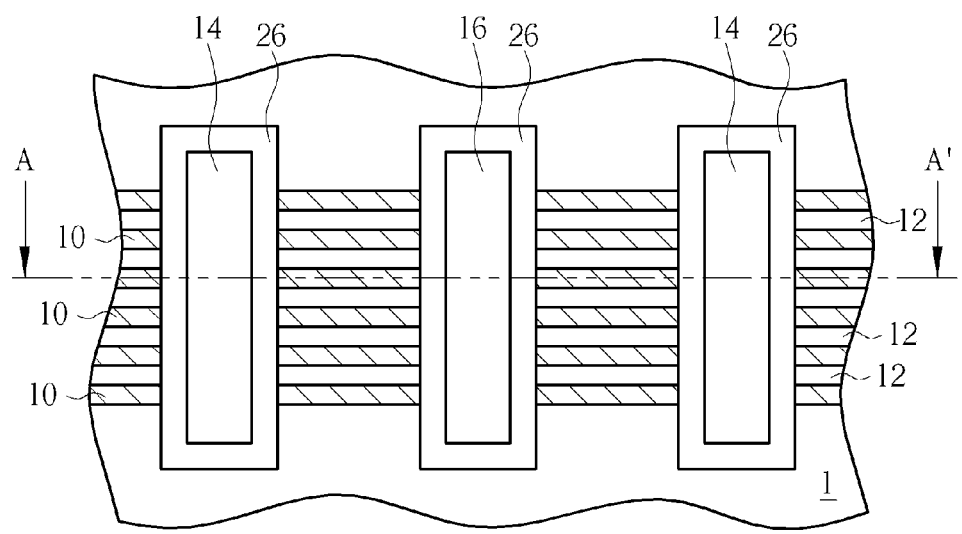
FIG. 1 depicts a top view of fins with gate structures crossing thereon.
Figure 2:
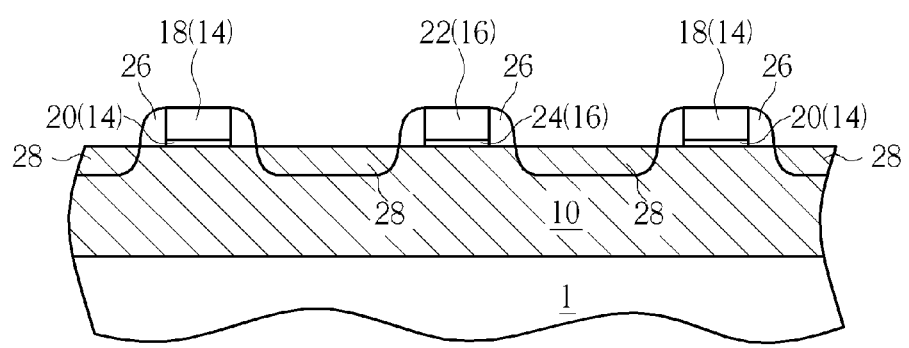

FIG. 1 depicts a top view of fins with gate structures crossing thereon. FIG. 2 to FIG. 6 depict a method of fabricating a single diffusion break according to a first preferred embodiment of the present invention, wherein FIG. 2 is a sectional view taken along line AA' in FIG. 1.

As shown in FIG. 1, a substrate 1 is provided. Numerous fins 10 are formed by patterning the substrate 1. A shallow trench isolation 12 is formed between the adjacent fins 10. At least two gate structures 14 and a middle dummy gate structure 16 cross the fins 10. The substrate 1 is may be a silicon substrate or a germanium substrate. The middle dummy gate structure 16 is sandwiched by the gate structures 14. In other words, the middle dummy gate structure 16 is disposed between the gate structures 14. Each of the gate structures 14 includes a gate electrode 18 and a gate dielectric layer 20 disposed below the gate electrode 18. The middle dummy gate structure 16 also includes a gate electrode 22 and a gate dielectric layer 24 disposed below the gate electrode 22. The middle dummy gate structure 16 and the gate structures 14 may be made simultaneously by patterning a polysilicon layer and a dielectric layer. Therefore, the gate electrodes 18/22 are made of polysilicon. The gate dielectric layers 20/24 may be made of silicon oxide. Then, three spacers 26 are formed, and each of the spacers 26 respectively surrounds the gate structures 14, and the middle dummy gate structure 16. The spacers 26 are preferably silicon nitride, silicon carbonitride, silicon oxycarbonitride or silicon oxide. Later, source/drain doping regions 28 are formed in each of the fins 10 between the spacers 26 by using the gate structures 14, the middle dummy gate structure 16 and the spacers 26 as masks. The source/drain doping regions 28 can be n-type or p-type. In one example, the source/drain doping region 28 between the middle dummy gate structure 16 and the gate structure 14 can have one conductive type, and the source/drain doping region between the middle dummy gate structure 16 and the other gate structure 14 can have another conductive type. The source/drain doping regions 28 with different conductive types should be formed by respective implantation processes. In another example, all the source/drain doping regions 28 are the same conductive type. In this way, all the source/drain doping regions 28 can be formed by a single implantation process.

Figure 3:
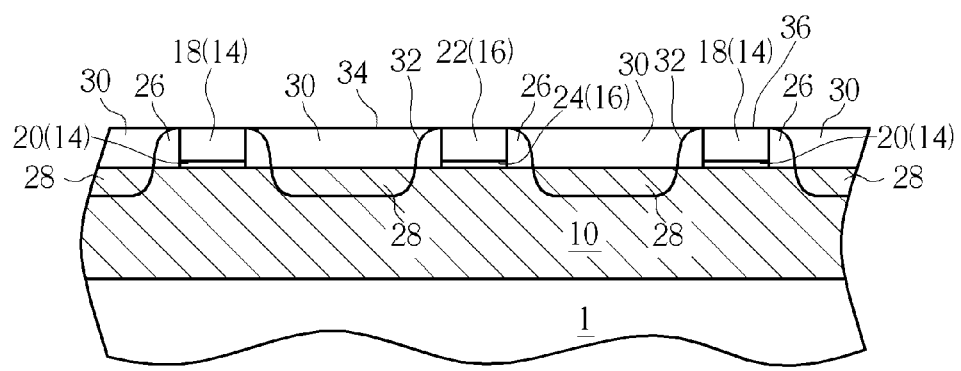

FIG. 3 through FIG. 6 show stages of the method subsequent to the stage shown in FIG. 2. Although only one fin is shown in the figure, other fins undergo the same process. As shown in FIG. 3, a dielectric layer 30 is formed to cover the middle dummy gate structure 16, the gate structures 14 and the spacers 26, and fills a gap 32 between the spacers 26. Subsequently, the dielectric layer 30 is planarized to make a top surface 34 of the dielectric layer 30 aligned with a top surface 36 of one of the gate structures 14.

Figure 4:
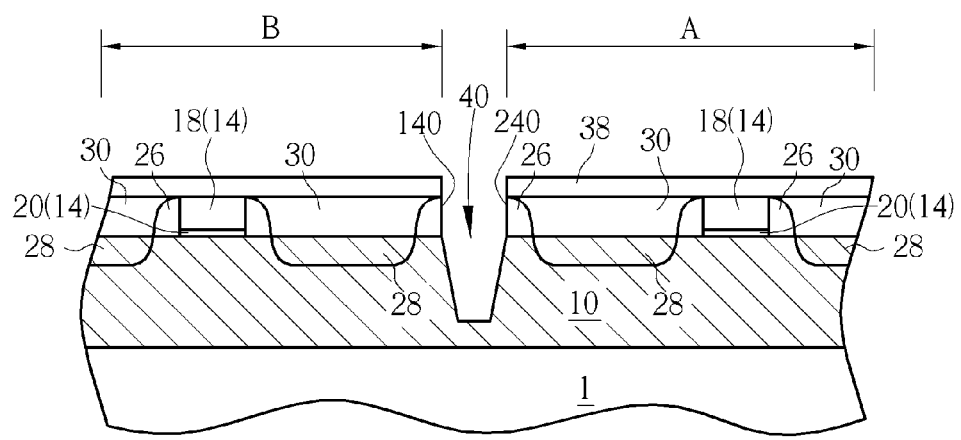

As shown in FIG. 4, a mask layer 38 such as a photo resist layer is formed to cover the dielectric layer 30. The mask layer 38 can be a single layer or tri-layered structure including a top photo resist layer, a silicon-containing hard mask and an organic under layer. Then, the mask layer 38 is patterned to expose only the middle dummy gate structure 16. Later, the middle dummy gate structure 16 and the fin 10 directly under the middle dummy gate structure 16 are removed to form a recess 40 by taking the mask layer 38 as a mask. The recess 40 separates the fin 10 into a first active region A and a second active region B. The middle dummy gate structure 16 and the fin 10 directly under the middle dummy gate structure 16 can be removed by an etching process. Two sidewalls 140/240 of the recess 40 are within the fin 10 and extend to the spacer 26 originally surrounding the middle dummy gate structure 16.

Figure 5:
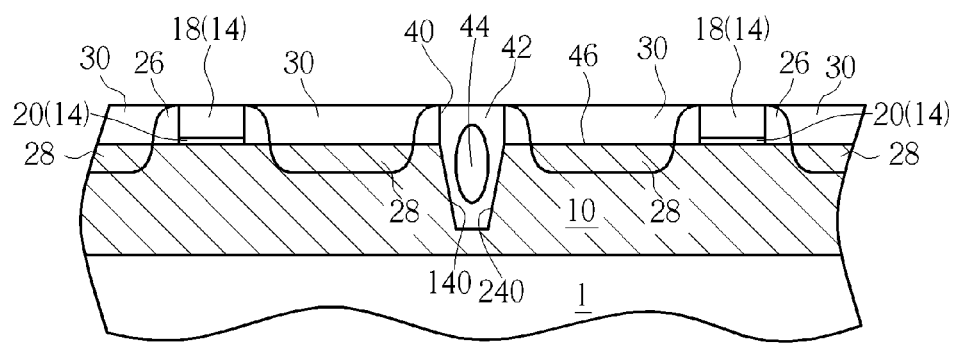

As shown in FIG. 5, the mask layer 38 is removed entirely. Then, an isolating layer 42 is formed in the recess 40 to close an entrance of the recess 40 to form a void 44 embedded within the recess 40. In detail, the isolating layer 42 is formed conformally to cover the gate structure 14, the dielectric layer 30, the sidewalls 140/240 and a bottom of the recess 40. By controlling the thickness of the isolating layer 42, the isolating layer 42 respectively on two sidewalls 140/240 of the recess 40 can contact each other, so the entrance of the recess 40 can be closed and the void 44 can be formed. Subsequently, the isolating layer 42 is planarized to remove the isolating layer 42 outside the recess 40. The isolating layer 40 serves as a single diffusion break, and is preferably silicon oxide. Moreover, part of the void 44 is preferably higher than a top surface 46 of the fin 10, and the rest of the void 44 is below the top surface 46 of the fin 10.

Figure 6:
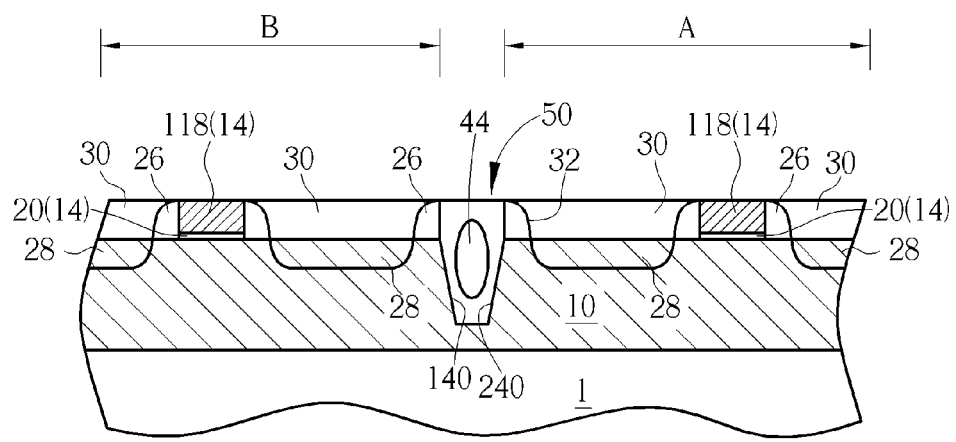

As shown in FIG. 6, based on different requirements, the gate electrodes 18 are removed and replaced by metal gate electrodes 118. In another preferred embodiment, the original gate electrodes 18 can be kept.

FIG. 1 to FIG. 2 and FIG. 7 to FIG. 10 depict a method of fabricating a single diffusion break according to a second preferred embodiment of the present invention, wherein FIG. 2 is a sectional view taken along line AA' in FIG. 1. FIG. 7 through FIG. 10 show stages of the method subsequent to the stage shown in FIG. 2, wherein like reference numerals are used to refer to like elements throughout. Please refer to the first preferred embodiment for the detailed description of elements designated by the same numerals. Although only one fin is shown in the figure, other fins undergo the same process.

Figure 7:
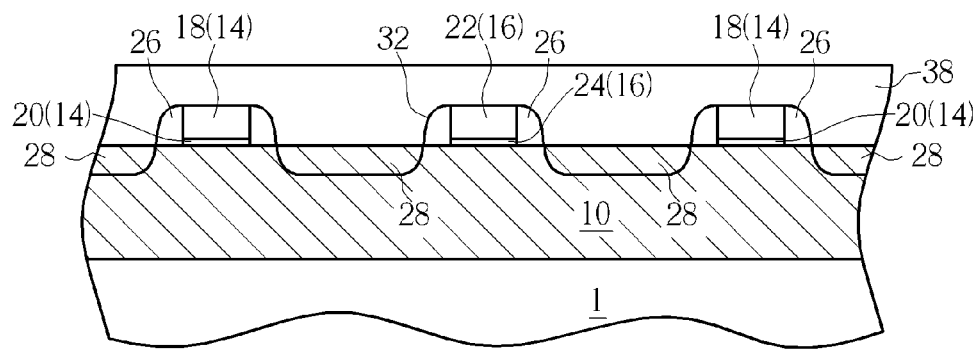
FIG. 7 to FIG. 10 depict a method of fabricating a single diffusion break according to a second preferred embodiment of the present invention.
Figure 8:
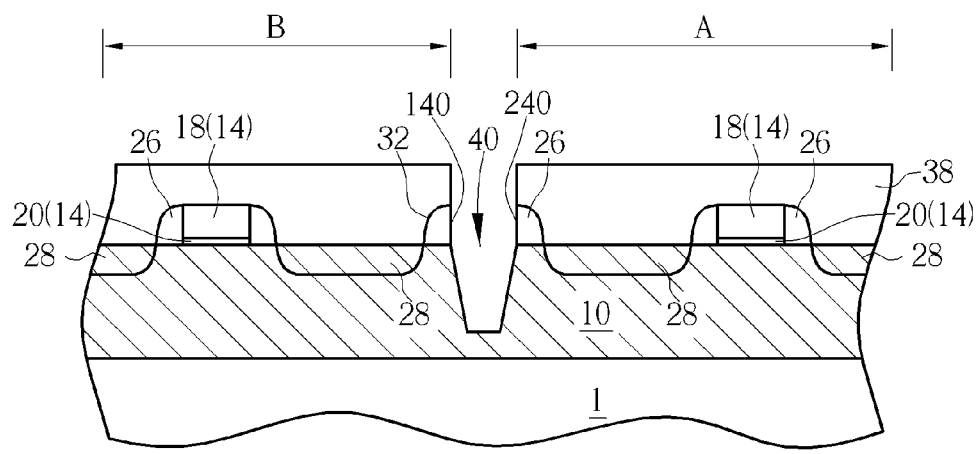

Similar to the steps shown in FIG. 1 and FIG. 2, two gate structures 14 and a middle dummy gate structure 16 are formed to cross the fin 10. Spacers 26 respectively surround the gate structures 14 and the middle dummy gate structure 16. Source/drain doping regions 28 are formed in the fin 10 between the spacers 26. As shown in FIG. 7, a mask layer 38 such as a photo resist layer is formed to cover the gate structures 14 and the middle dummy gate structure 16 and fill up a gap 32 between the spacers 26. As shown in FIG. 8, the mask layer 38 is patterned to expose only the middle dummy gate structure 16. Later, the middle dummy gate structure 16 and the fin 10 directly under the middle dummy gate structure 14 are removed to form a recess 40 by taking the mask layer 38 as a mask. The middle dummy gate structure 16 and the fin 10 directly under the middle dummy gate structure 16 can be removed by an etching process. Two sidewalls 140/240 of the recess 40 are within the fin 10 and extend to the spacer 26 originally surrounding the middle dummy gate structure 16.

Figure 9:
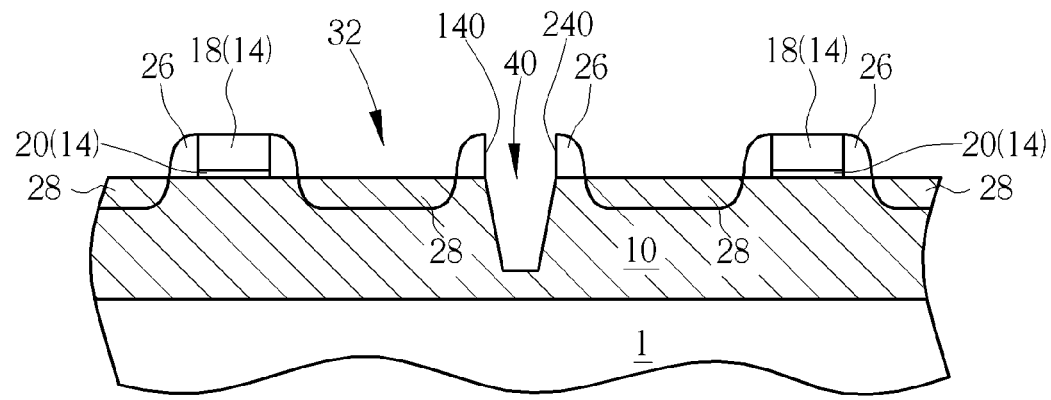
Figure 10:
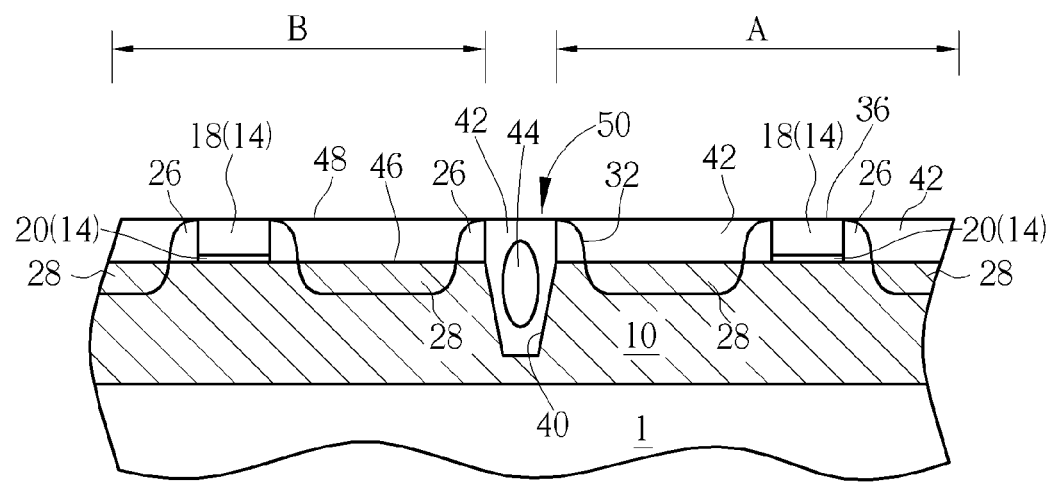

As shown in FIG. 9, the patterned mask layer 38 is removed entirely. Therefore, the gap 32 between the spacer 26 is exposed. As shown in FIG. 10, an isolating layer 42 is formed to fill in the recess 40 and the gap 32. The isolating layer 42 in the recess 40 closes an entrance of the recess 40 to form a void 44 embedded within the recess 40. Subsequently, the isolating layer 42 is planarized to make a top surface 48 of the isolating layer 42 aligned with a top surface 36 of one of the gate structures 14. The isolating layer 42 in the recess 40 serves as a single diffusion break 50. The isolating layer 42 may be silicon oxide. Moreover, part of the void 44 is preferably higher than a top surface 46 of the fin 10, and the rest of the void 44 is below the top surface 46 of the fin 10. After the isolating layer 42 is planarized, the gate electrodes 18 can be optionally removed and replaced by metal gate electrodes.

The difference between the first preferred embodiment and the second preferred embodiment is that, in the second preferred embodiment, the isolating layer 42 not only serves as the single diffusion break 48 but also replaces the position of the dielectric layer 30 in the first preferred embodiment. Furthermore, before the recess 40 is formed, the position of the dielectric layer 30 in the first preferred embodiment is replaced by the mask layer 38.

FIG. 6 depicts a semiconductive device with a single diffusion break according to a third preferred embodiment of the present invention. As shown in FIG. 6, a substrate 1 is provided. A fin 10 is formed thereon by pattering the substrate 1. The fin 10 is divided into a first active region A and a second active region B. A single diffusion break 50 is embedded in the fin 10 and between the first active region A and the second active region B, wherein part of the single diffusion break 50 is embedded in the fin 10 and the rest of the single diffusion break 50 is higher than a top surface 46 of the fin 10 within the first active region A. The single diffusion break 50 includes a void 44 inside. A part of the void 44 is higher than the top surface 46 of the fin 10 within the first active region A. Two gate structures 14 are disposed on the fin 10 within the first active region A and within the second active region, respectively. The gate structures 14 actually cross the fin 10; refer to FIG. 1 for relative positions of the gate structures 14 and the fin 10 from the top view.

Refer back to FIG. 6. Each gate structure 14 includes a gate electrode 118 and a gate dielectric layer 14 disposed below the gate electrode 118. The gate electrode 118 can be metal or polysilicon. FIG. 6 shows the gate electrode 118 as metal. The semiconductive device with a single diffusion break further includes spacers 26 respectively surrounding the gate structures 14, and the single diffusion break 50. The spacers 26 are preferably silicon nitride, silicon carbonitride, silicon oxycarbonitride or silicon oxide. Furthermore, source/drain doping regions 28 are respectively disposed at two sides of the gate structures 14 and within the first active region A and the second active region B of the fin 10.

The source/drain doping regions 28 within the first active region A can have different conductive types from the source/drain doping regions 28 within the second active region B. In another example, the source/drain doping regions 28 within the first active region A and within the second active region B have the same conductive type. A dielectric layer fills 30 a gap 32 between the spacers 26. Both of the dielectric layer 30 and the single diffusion break 50 can be silicon oxide. At this point, the gate structure 14, the fin 10, and the source/drain doping regions 28 within the first active region A form a first FinFET (Fin Field-Effect Transistor). The gate structure 14, the fin 10, and the source/drain doping regions 28 within the second active region B form a second FinFET. The single diffusion break 50 isolates the first FinFET and the second FinFET.

FIG. 10 depicts a semiconductive device with a single diffusion break according to a fourth preferred embodiment of the present invention. The difference between the third preferred embodiment and the fourth preferred embodiment is that the dielectric layer 30 in the third preferred embodiment is replaced by an isolating layer 42 in the fourth preferred embodiment. The isolating layer 42 also forms the single diffusion break 50. Although the fourth preferred embodiment shows the gate electrodes 18 as polysilicon electrodes as an example, the gate electrode 18 in the fourth preferred embodiment can be a metal gate electrode based on different requirements. Other elements are basically the same as those illustrated in the third preferred embodiment. The description related to the third preferred embodiment can be referred to for details.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a single diffusion break, comprising
   providing a fin with two gate structures crossing the fin and a middle dummy gate structure crossing the fin, wherein the middle dummy gate structure is sandwiched by the gate structures;
   forming a plurality of spacers, each spacer respectively surrounding the gate structures and the middle dummy gate structure;
   removing the middle dummy gate structure and part of the fin directly under the middle dummy gate structure to form a recess; and
   forming an isolating layer in the recess to close an entrance of the recess so as to form a void embedded within the recess, wherein a part of the void is higher than a top surface of the fin.

2. The method of fabricating a single diffusion break of claim 1, wherein each of the gate structures comprises a gate electrode and a gate dielectric layer disposed under the gate electrode.

3. The method of fabricating a single diffusion break of claim 2, further comprising:
   after forming the isolating layer, replacing the gate electrode with metal.

4. The method of fabricating a single diffusion break of claim 1, further comprising:
   after forming the spacers, forming source/drain doping regions at two sides of each gate structure.

5. The method of fabricating a single diffusion break of claim 1, further comprising:
   after forming the spacers and before removing the middle dummy gate structure, forming a dielectric layer on the fin and filling a gap between spacers;
   forming a mask layer covering the dielectric layer, the middle dummy gate structure and the gate structures; and
   patterning the mask layer to expose only the middle dummy gate structure.

6. The method of fabricating a single diffusion break of claim 1, further comprising:
   after forming the spacers and before removing the middle dummy gate structure, forming a mask layer covering the gate structures and the middle dummy gate structure and filling a gap between the spacers; and
   patterning the mask layer to expose only the middle dummy gate structure.

7. The method of fabricating a single diffusion break of claim 6, further comprising:
   after removing the middle dummy gate structure and before forming the isolating layer, removing the mask layer entirely; and
   after removing the mask layer, forming the isolating layer in the recess and in the gap between the spacers.

8. The method of fabricating a single diffusion break of claim 6, wherein the mask layer is a tri-layered structure including a top photo resist layer, a silicon-containing hard mask and an organic under layer.

9. A semiconductive device with a single diffusion break, comprising:
   a fin divided into a first active region and a second active region;
   a single diffusion break disposed between the first active region and the second active region, the single diffusion break comprising a void inside, wherein part of the single diffusion break is embedded in the fin, a rest of the single diffusion break is higher than a top surface of the fin within the first active region and a part of the void is higher than a top surface of the fin within the first active region;
   a first gate structure crossing the fin within the first active region; and
   a second gate structure crossing the fin within the second active region.

10. The semiconductive device with a single diffusion break of claim 9, further comprising:
    a plurality of spacers respectively surrounding the first gate structure, the second gate structure and the single diffusion break.

11. The semiconductive device with a single diffusion break of claim 10, further comprising:
    an isolating layer disposed within a gap between the spacers, wherein the single diffusion break comprises a first material, and the isolating layer is made of the first material.

12. The semiconductive device with a single diffusion break of claim 10, further comprising:
    a dielectric layer disposed within a gap between the spacers.

13. The semiconductive device with a single diffusion break of claim 9, further comprising:
    source/drain doping regions disposed in the fin and at two sides of the first gate structure and at two sides of the second gate structure.

* * * * *